United States Patent [19]

Hasken

[11] Patent Number: 5,896,030
[45] Date of Patent: Apr. 20, 1999

[54] MAGNETIC SENSOR WITH COMPONENTS ATTACHED TO TRANSPARENT PLATE FOR LASER TRIMMING DURING CALIBRATION

[75] Inventor: Randall J. Hasken, Lanark, Ill.

[73] Assignee: Honeywell Inc., Minneapolis, Minn.

[21] Appl. No.: 08/731,103

[22] Filed: Oct. 9, 1996

[51] Int. Cl.⁶ .......................... G01N 27/72; G01R 33/12; G01R 35/00
[52] U.S. Cl. .......................................... 324/235; 324/202
[58] Field of Search .......................... 324/207.2, 207.21, 324/235, 251, 252, 202, 225; 338/32 R, 32 H; 428/335

[56] References Cited

U.S. PATENT DOCUMENTS

| | | |
|---|---|---|
| 4,146,673 | 3/1979 | Headley ........................ 428/335 |
| 4,524,932 | 6/1985 | Bodziak ........................ 324/207.2 |
| 5,021,736 | 6/1991 | Gonsalves et al. . |
| 5,216,405 | 6/1993 | Schroeder et al. . |
| 5,341,097 | 8/1994 | Wu . |
| 5,444,370 | 8/1995 | Wu . |

Primary Examiner—Walter E. Snow
Attorney, Agent, or Firm—William D. Lanyi; Roland W. Norris

[57] ABSTRACT

A magnetic sensor is provided with a permanent magnet structure, a magnetically sensitive component and a transparent plate through which the magnetically sensitive component can be selectively trimmed by a laser beam through the transparent plate. The magnetically sensitive component is attached to an under surface of the plate which is provided with conductive runs, conductive circuit points and conductive pads. The magnetically sensitive component is provided with solder bumps that are soldered to the conductive circuit points on the under surface of the transparent plate. The magnetically sensitive component is rigidly attached to the permanent magnet structure by an epoxy or other suitable material. This disposes the magnetically sensitive component between the transparent plate and the permanent magnet structure. The magnetically sensitive component can be calibrated by laser trimming resistors on an integrated chip through the transparent plate.

20 Claims, 7 Drawing Sheets

MAGNETIC SENSOR WITH COMPONENTS ATTACHED TO TRANSPARENT PLATE FOR LASER TRIMMING DURING CALIBRATION

BACKGROUND OF THE INVENTION

1. Field of the Invention

The present invention relates generally to magnetic sensors and, more particularly, to a geartooth sensor which comprises a transparent plate through which a magnetically sensitive component can be calibrated by selectively trimming resistors on a semiconductor chip.

2. Description of the Prior Art

Many different types of geartooth sensors are known to those skilled in the art. Packaging techniques used in the manufacture of geartooth sensors vary significantly, based on the intended application of the sensor and the operational characteristics required for the application.

In certain magnetic sensors, two operational parameters are very important. First, the permanent magnet used in the sensor must be placed as close as possible to the target, which is generally a tooth of a gear that is positioned to move through a detection zone of the sensor. Secondly, accuracy requirements of the magnetic sensor often necessitate that internal stresses on the magnetically sensitive component be overcome to reduce the resulting offset signals and the sensor's sensitivity to thermal expansion.

It is known to those skilled in the art that magnetically sensitive components can be disposed on the pole face of a permanent magnet for applications in magnetic sensors. It is also known to those skilled in the art that magnetically sensitive components can be disposed directly on a lead assembly or other component that exhibits ferromagnetic characteristics. A ferromagnetic platform on which the magnetically sensitive component is disposed can serve as a pole piece for the sensor.

U.S. Pat. No. 5,021,736, which issued to Gonsalves et al on Jun. 4, 1991, discloses a sensor calibration method with an angular adjustment of a magnetoresistive element. The transducer arrangement comprises a magnetoresistive transducer including a magnetoresistive element which is responsive to magnetic flux passing through it in a predetermined direction to change its electrical resistance as a function of the intensity of the magnetic flux in the predetermined direction. A magnet is used to provide the magnetic flux. The transducer can include a permanent magnet having a planar surface with a magnetoresistive element offset from the axis of the magnet and optionally at an angle to the planar surface. The transducer can also include a concave surfaced magnet with the magnetoresistive element at an acute angle to the parallel flux lines emanating from the concave surface. As a further embodiment, the magnetoresistive element can be tilted on the magnet surface in two directions to provide a bias field and calibration. As a third embodiment, a high permeability pole piece can be positioned on the magnet surface between the magnet and the magnetoresistive element to minimize field variation due to nonuniformities in the magnet. There is also provided a module including an aluminum bracket mountable at the fore portion thereof and containing a magnetoresistive transducer circuit at the aft portion thereof, the circuit being coupled to a semiconductor circuit disposed at the center of the bracket. An epoxy resin encases the transducer circuit and semiconductor circuit as well as an optional cable or electrical connector at the fore portion of the bracket.

U.S. Pat. No. 5,216,405, which issued on Jun. 1, 1993 to Schroeder et al, describes a package for a magnetic field sensitive device. The package is intended for use with a magnetic field sensitive element, such as a magnetoresistor, and includes at least two planar layers of a relatively stiff ferromagnetic material which is also electrically conductive. The layers have opposed edges which are in closely spaced relation to form a narrow gap therebetween. A terminal tap is integral with and extends from each layer. A magnetic field sensitive element is on a surface of at least one of the layers and preferably extends across the gap to be on both layers. The magnetic field sensitive element has a pair of contacts each of which is electrically connected to a separate one of the layers. A permanent magnet is mounted on and insulated from the surface of the layers opposite the magnetic field sensitive element. A protective layer of an insulating material may cover the magnetic field sensitive element and the layers with the terminal tabs extending therefrom.

U.S. Pat. No. 5,341,097, which issued to Wu on Aug. 23, 1994, discloses an asymmetrical magnetic position detector. The geartooth sensor incorporates a magnet and two magnetically sensitive devices, such as Hall effect elements. The two magnetically sensitive devices are disposed in a common plane with each other with one of the devices being located at a position closer to the magnet than the other device. The common plane in which both magnetically sensitive devices are disposed is spaced apart from a central axis of the magnet by a predetermined distance. A divider is provided for determining a ratio of the magnetic field strengths that are imposed perpendicularly on the first and second magnetically sensitive devices. The ratio is used to distinguish between teeth and slots proximate the sensor wherein the common plane of the magnetically sensitive devices is generally perpendicular to the path along which the teeth and slots pass.

U.S. Pat. No. 5,444,370, which issued to Wu on Aug. 22, 1995, discloses a magnetic angular position sensor with two magnetically sensitive components arranged proximate two target tracks having complementary magnetic and nonmagnetic segments. The sensor is provided with two target tracks arranged in generally parallel association with each other. Each of the target tracks comprises magnetic and nonmagnetic segments which are arranged in alternating patterns. First and second magnetically sensitive components are disposed proximate the first and second target tracks, respectively, and a source of magnetic field is disposed proximate the first and second magnetically sensitive components. Distortions of the magnetic field imposed perpendicularly on the first and second magnetically sensitive components are used to provide first and second output signals therefrom. A third output signal, which is a function of the first and second output signals, is used to determine the location of the first and second target tracks with respect to the first and second magnetically sensitive components. The magnetic and nonmagnetic segments of the first and second target tracks can be different sizes and arranged in a pattern which permits the specific and absolute location of a movable object to be determined.

The United States Patents described immediately above are hereby explicitly incorporated by reference in this description.

In view of the known types of magnetic sensors, it would be beneficial if a means were developed for manufacturing a magnetic sensor that disposes the permanent magnet at a location as close as possible to the path along which ferromagnetic objects of a target are intended to pass. In addition, it would be significantly beneficial if a means were developed that allows a magnetic sensor to be manufactured in a manner that permits calibration to be performed after all or most manufacturing steps which might induce stresses in the magnetically sensitive components of the sensor are completed.

SUMMARY OF THE INVENTION

A magnetic sensor made in accordance with the present invention comprises a permanent magnet structure and a magnetically sensitive component having a first surface and a second surface. In addition, it comprises a plate which is transparent to a preselected type of radiation, such as a laser beam. The first surface of the magnetically sensitive component is attached to the plate, with the magnetically sensitive component being disposed between the permanent magnet structure and the plate. In addition, a plurality of conductive elements is disposed on a surface of the plate and connected in electrical communication between preselected portions of the first surface of the magnetically sensitive component.

In a preferred embodiment of the present invention, the permanent magnet structure comprises a permanent magnet and a pole piece disposed on a pole face of the permanent magnet. However, it should be understood that the pole piece is not a required element in all embodiments of the present invention. In addition, the magnetically sensitive component comprises a plurality of individual chips in a preferred embodiment of the present invention. The first surface of each of the plurality of individual chips are attached to the plate. The individual chips can, in turn, comprise an integrated circuit chip and one or more separate sensor chips. The sensor chips can be magnetoresistive. Alternatively, the sensor chips can comprise Hall effect elements or indium antimonide elements. The particular material used to provide the magnetic sensitivity is not limiting to the present invention. With the integrated circuit exposed through the thickness of the transparent plate, a resistor network can be selectively trimmed by a laser that is directed to pass through the thickness of the plate. This trimming can then be performed following the assembly of all the other components into a singular structure. This calibration can therefore compensate for stresses induced in the magnetically sensitive components during the assembly process. As a result, the signal offset that could be induced by these stresses can be compensated during the calibration process.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Throughout the Description of the Preferred Embodiment, like components will be identified by like reference numerals.

Figure 1:
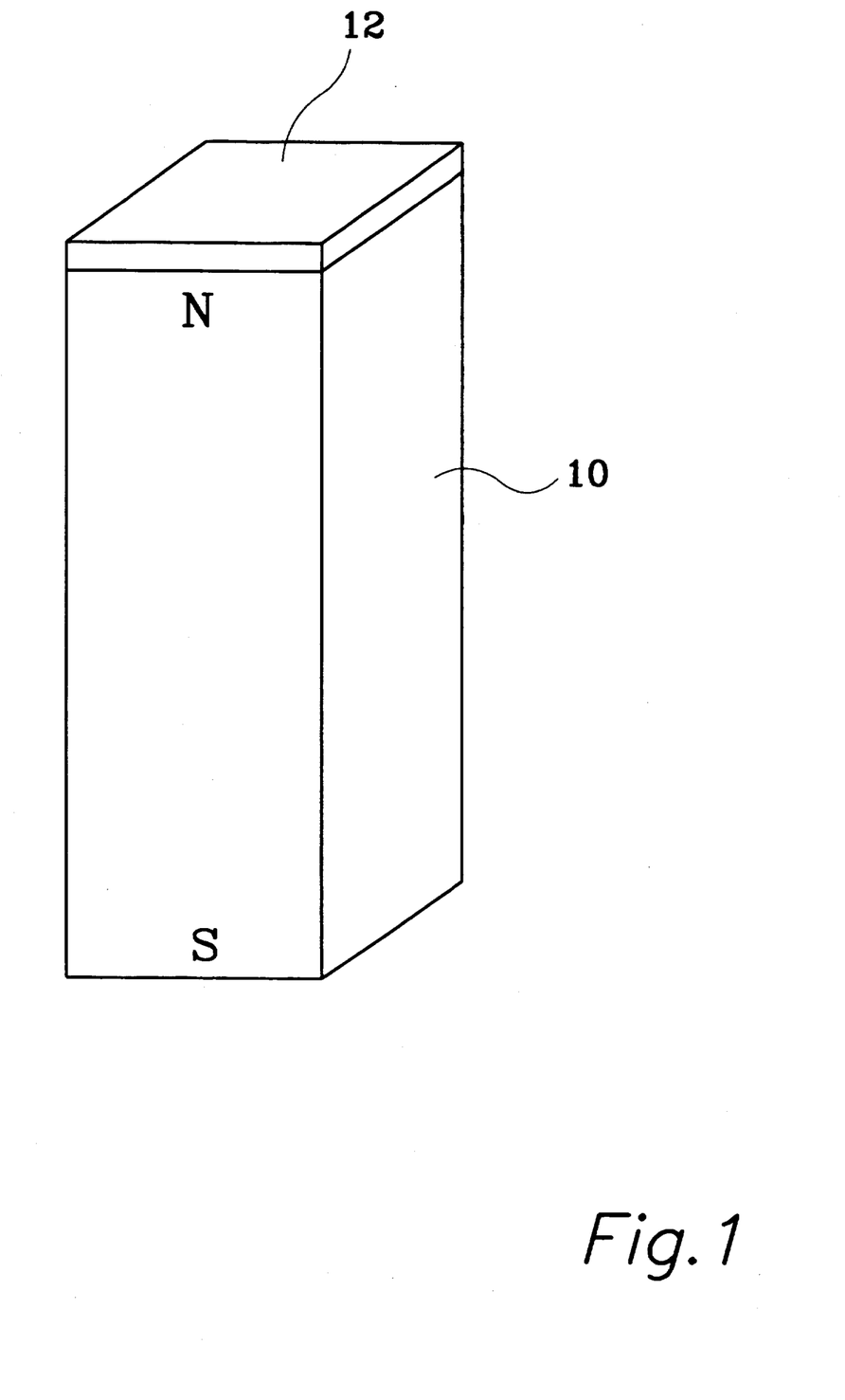
FIG. 1 illustrates a permanent magnet structure comprising a permanent magnet and a pole piece.

A preferred embodiment of the present invention comprises a permanent magnet structure as illustrated in FIG. 1. The permanent magnet structure comprises a permanent magnet 10 with a pole piece 12 disposed on a pole face of the magnet. In a typical application, the pole piece 12 can comprise a ferromagnetic material such as one which is 39% to 42% nickel, less than 1% each of carbon, manganese and silicon with the balance being iron. The purpose of the pole piece 12 is to provide a more uniform magnetic field emanating from the permanent magnet 10 and to thereby avoid the magnetic anomalies that could otherwise be caused by nonuniform magnetization of the permanent magnet 10.

Figure 2:
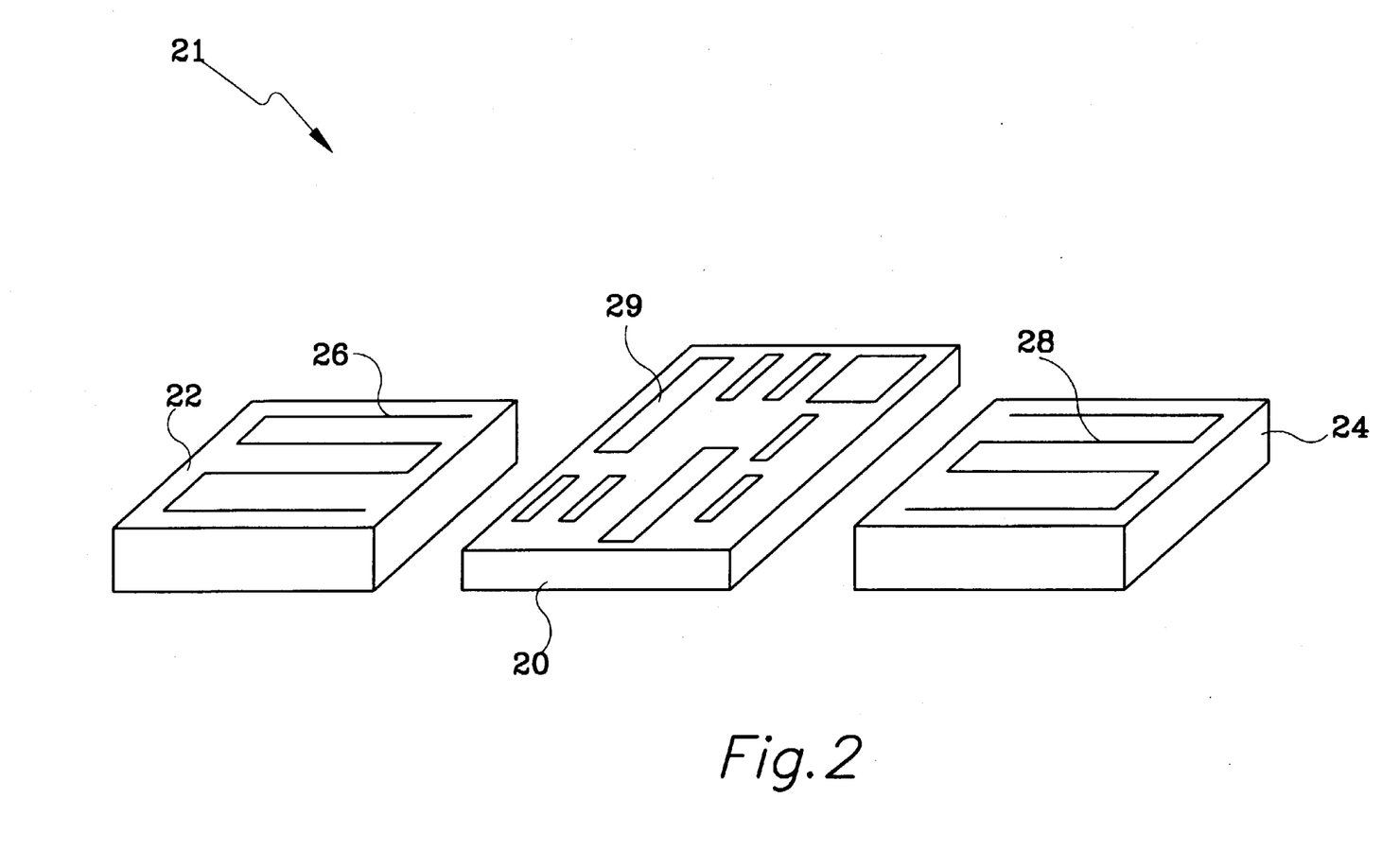
FIG. 2 illustrates the elements of a magnetically sensitive component used in conjunction with the present invention.

A preferred embodiment of the present invention also comprises a magnetically sensitive component having a first surface and a second surface. In many applications of the present invention, the magnetically sensitive component comprises a plurality of individual components that cooperate with each other to provide an output signal that is representative of the magnetic field imposed on the magnetically sensitive component. In FIG. 2, the magnetically sensitive component comprises an integrated circuit chip 20 and two magnetically sensitive element chips, 22 and 24. Each of the magnetically sensitive element chips, 22 and 24, are represented schematically as comprising a serpentine resistor disposed on their first surfaces. The serpentine resistors are identified by reference numerals 26 and 28, respectively. The integrated circuit chip 20 contains the various individual components necessary to amplify and condition the signals received from the two magnetically sensitive element chips, 22 and 24. The specific components contained in the integrated circuit chip 20 are not limiting to the present invention, but is illustrated schematically in FIG. 2 for the purpose of this description. On a first surface of the integrated circuit chip 20, one of the elements contained in the integrated circuit is an array of resistors. These resistors are trimmable by a laser during a calibration process and allow the calibration procedure to compensate for certain stress related offsets in the output signal from the integrated circuit. During a typical calibration process, the magnetically sensitive component, which comprises elements 20, 22 and 24, is subjected to a magnetic field under certain predetermined conditions and the trimmable resistors are selectively altered in order to achieve a preselected output signal under those predetermined conditions.

With continued reference to FIG. 2, reference numeral 29 symbolically represents a portion of the integrated circuit on the first surface of the integrated circuit chip 20 that contains the trimmable resistors. It should be clearly understood that the illustration in FIG. 2 is exemplary in nature and is not intended to represent a dimensionally accurate illustration. As is known by those skilled in the art, the individual elements of an integrated circuit are extremely small and therefore difficult to illustrate with any clarity. Because of this, various dimensions in FIG. 2 have been intentionally exaggerated for purposes of this discussion.

Figure 3:
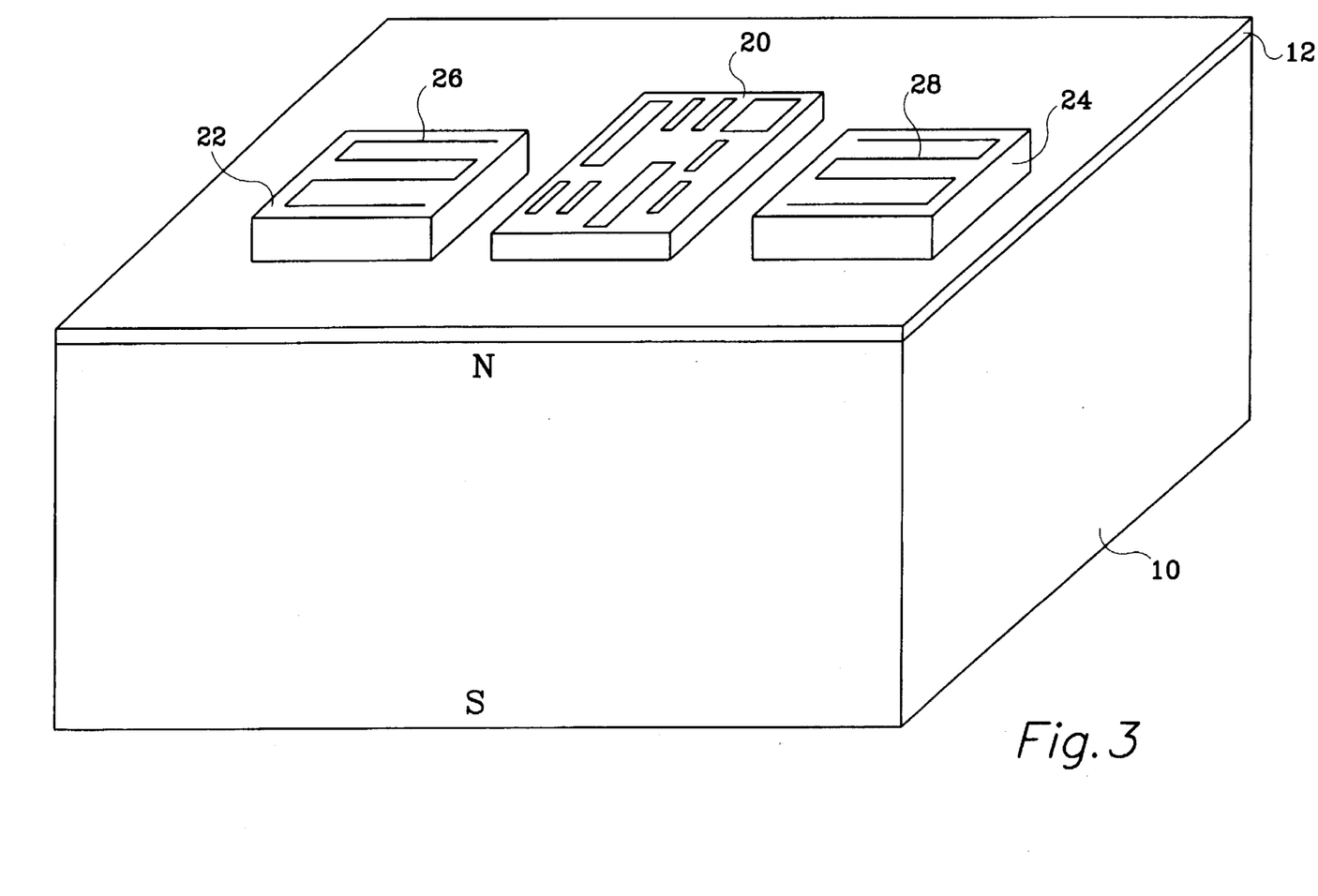
FIG. 3 shows the magnetically sensitive component attached to an upper surface of the permanent magnet structure.

FIG. 3 shows the magnetically sensitive component, described above in conjunction with FIG. 2, disposed on a surface of the permanent magnet structure which comprises the permanent magnet 10 and the pole piece 12 described in conjunction with FIG. 1. In FIG. 3, the illustration has been enlarged in the horizontal direction and reduced in the vertical direction for purposes of the illustration. However, it should be clearly understood that in most applications the permanent magnet 10 would be much larger in the direction along its polar axis than in its width. The configuration shown in FIG. 3 disposes the magnetically sensitive component within the magnetic field of the permanent magnet 10 with the pole piece 12 serving to make the magnetic field more uniform than would otherwise be expected without the use of the pole piece 12.

FIG. 3 shows the physical relationship between the locations of the various elements of the magnetically sensitive component 21 relative to the permanent magnet structure comprising the permanent magnet 10 and the pole piece 12. The purpose of the present invention is to achieve the relative positions of the components shown in FIG. 3, but with the added advantage of reducing the distance between the pole face of the permanent magnet 10 and a ferromagnetic object used as a target in conjunction with the magnetic sensor. It should be realized that the individual elements, 20, 22 and 24, of the magnetically sensitive component 21 must be connected to each other and to external devices so that the magnetic sensor can be effectively used to sense the position or movement of a ferromagnetic object moving toward its detection zone. These connections must be provided above the first surfaces of the elements of the magnetically sensitive component 21. In many types of known magnetic sensors, the connections above the first surfaces of the elements, 20, 22 and 24, requires wire bonds that, in turn, require space above the elements and also expand the distance between the pole face of the permanent magnet 10 and the detection zone through which the ferromagnetic targets can pass. It should be understood that the first surfaces of the individual components shown in FIG. 3 are the upper surfaces that extend away from the pole piece 12. Second surfaces of each of the elements, 20, 22 and 24, are disposed in contact with the pole piece 12 and are attached thereto.

Figure 4:
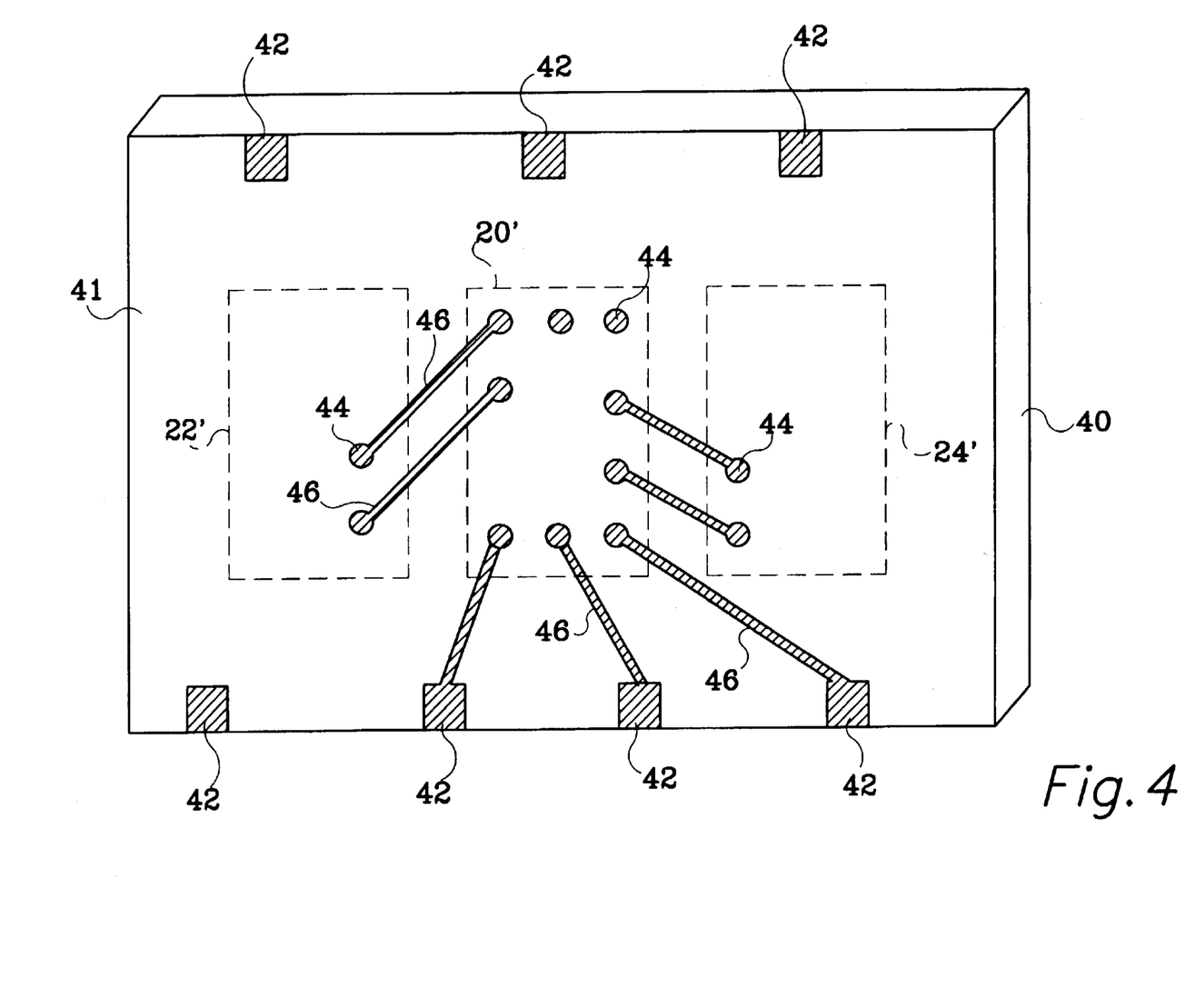
FIG. 4 shows a transparent plate with a surface on which conductive elements are disposed.

FIG. 4 shows a plate 40 that is generally transparent to a predetermined form of radiation, such as a laser. On its surface 41, a plurality of conductive elements is disposed. The conductive elements can comprise three forms. First, a plurality of conductive pads 42 can be deposited on the surface 41 of the plate 40. In addition, a plurality of conductive circuit points 44 are disposed on the surface 41 at preselected locations to conform with locations on the first surface of the magnetically sensitive component 21 described above. Thirdly, conductive runs 46 are used to interconnect various conductive circuit points 44 with other conductive points 44 or with the conductive pads 42. The conductive circuit points 44, the conductive pads 42 and the conductive runs 46 are disposed on surface 41 of plate 40 to provide the interconnections that connect various locations on the first surface of the magnetically sensitive 21 in electrical communication and in signal communication with each other. These conductive elements on surface 41 eliminate the need for wire bonds to connect the various elements of the magnetically sensitive component to each other. Therefore, the use of the plurality of conductive elements on the surface 41 of plate 40 serves the valuable purpose of reducing the distance between the permanent magnet 10 and the ferromagnetic target passing through the detection zone of the magnetic sensor.

With continued reference to FIG. 4, the dashed lines represent the locations where the elements, 20, 22 and 24, of the magnetically sensitive component 21 will eventually be located in contact with the surface 41 and with preselected conductive circuit points disposed on surface 41 of plate 40. These dashed boxes are identified by reference numerals 20', 22' and 24' to show the locations where elements 20, 22 and 24, respectively, will be located after further assembly as will be described in greater detail below.

Figure 5:
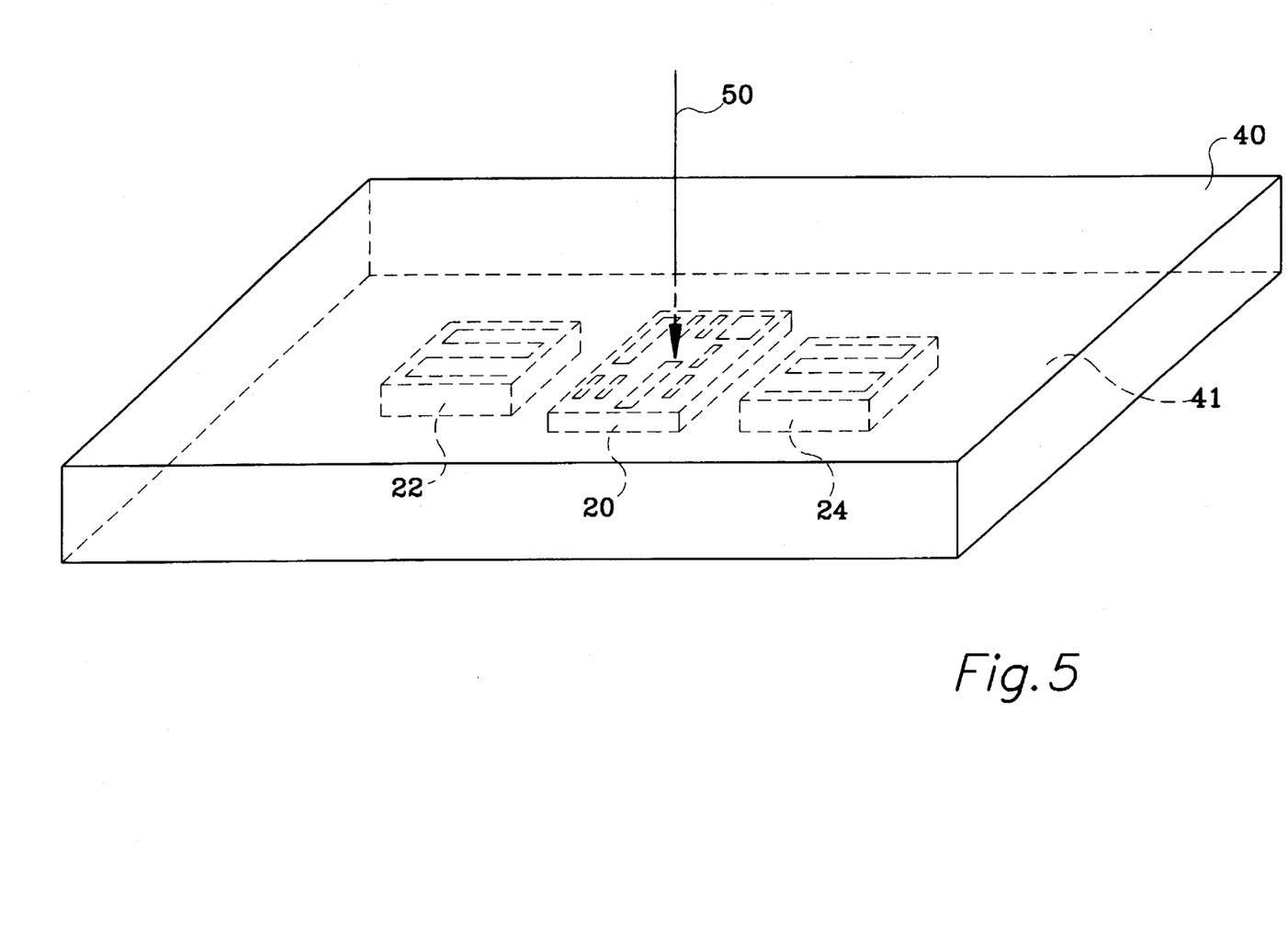
FIG. 5 shows another view of the conductive plate with the magnetically sensitive component attached to an underside thereof.

FIG. 5 shows the plate 40 with the elements, 20, 22 and 24, of the magnetically sensitive component 21 disposed in contact with the surface 41 of plate 40. The elements are attached to the under surface 41 of plate 40 at the locations previously described in conjunction with FIG. 4 and illustrated as dashed boxes, 20', 22' and 24'. These elements are represented by dashed lines in FIG. 5 in order to show their position and signify that they are located underneath the plate 40.

With continued reference to FIG. 5, it should be understood that plate 40 is transparent to a preselected type of radiation, such as a laser beam. Arrow 50 schematically represents a laser beam passing through the plate 40 and selectively trimming preselected resistors on the first surface of the integrated circuit chip 20. It should be noted that this calibration procedure can occur after the elements of the magnetically sensitive component are rigidly attached to the surface 41 of the plate 40. In fact, the calibration procedure in accordance with the present invention can take place after the attachment of the elements, 20, 22 and 24, to the surface 41 of plate 40 because they require the interconnections provided by the conductive circuit points 44, the conductive runs 46 and the conductive pads 42 described above in conjunction with FIG. 4. The attachment of the first surface of the magnetically sensitive component 21 to surface 41 of the plate 40 provides the electrical communication between the preselected circuit points that enables the device to be operated actively for purposes of the calibration procedure. Although not illustrated in FIG. 5, it should be understood that the calibration procedure typically takes place with the permanent magnet structure disposed beneath the elements of the magnetically sensitive component 21. In other words, the individual elements of the magnetically sensitive component 21 are disposed between the permanent magnet structure and plate 40. This arrangement will be described in greater detail below.

Figure 6:
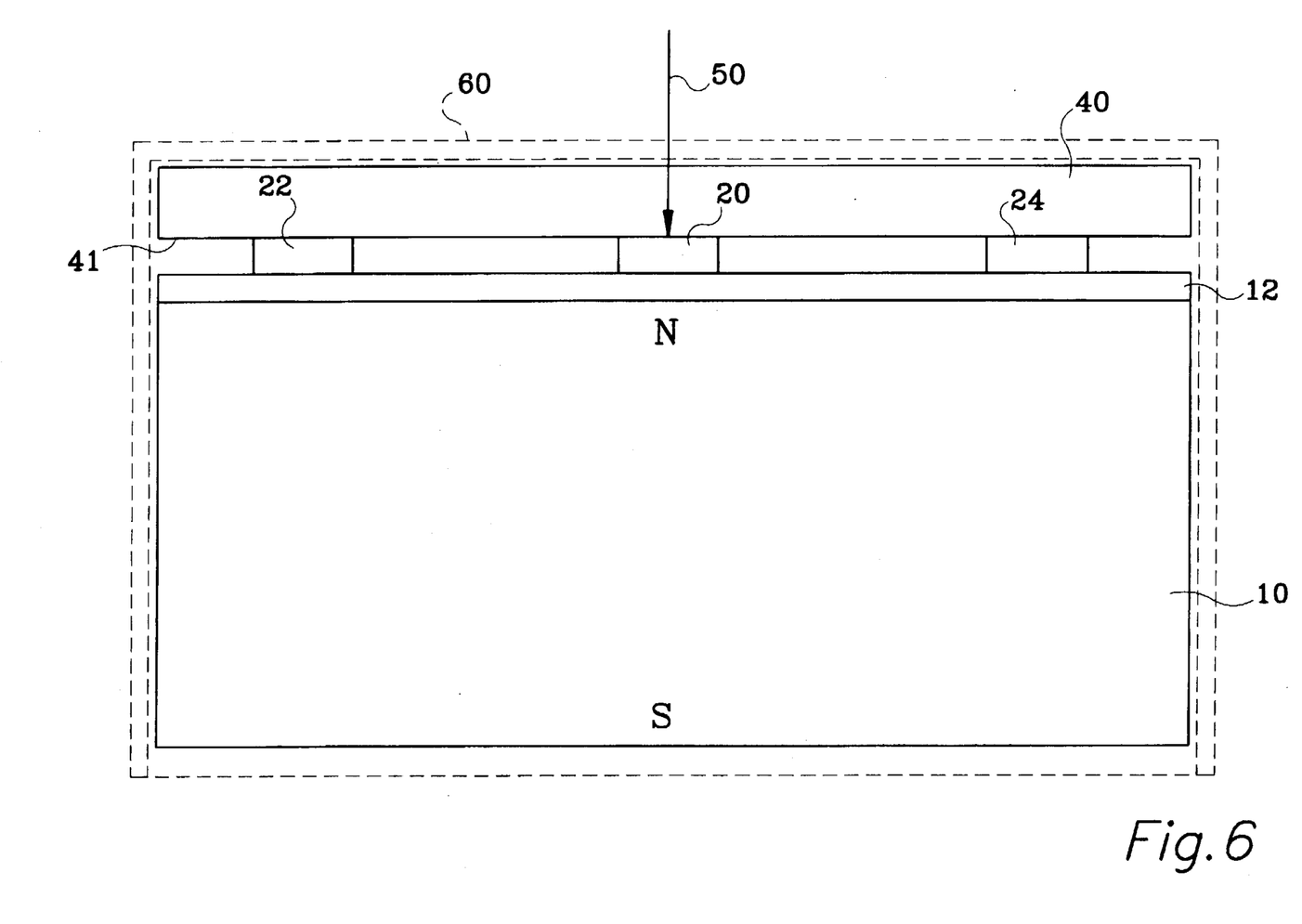
FIG. 6 is a side view of one embodiment of the present invention.

FIG. 6 is a side view of a preferred embodiment of the present invention. A permanent magnet 10 is provided with a pole piece 12 which can be a thin layer of a ferromagnetic material. For example, the layer of the pole piece 12 can be 0.005 inch thick and can comprise any suitable ferromagnetic material. The deposition of the pole piece layer 12 on the permanent magnet 10 improves the uniformity of the magnetic field emanating from the magnet. Plate 40 is typically 0.015 inches thick and comprises a transparent glass in a preferred embodiment of the present invention. Many types of glass, which are transparent to a laser beam for the purpose of trimming resistors on the integrated circuit 20, are commercially available from the Pyrex Glass Corporation. The individual elements, 20, 22 and 24, of the magnetically sensitive component 21 are connected to the surface 41 of plate 40 by soldering preselected locations on the first surface of the magnetically sensitive component to the conductive circuit points 44 described above in conjunction with FIG. 4. One method for accomplishing this task is to provide the first surface of the various elements, 20, 22 and 24, of the magnetically sensitive component 21 with "solder bumps" which can be placed in contact with the conductive circuit points 44 that are disposed on surface 41 of the plate 40. Application of heat causes the solder bumps to become molten and attach the elements of the magnetically sensitive component to surface 41. Resolidification of the solder bumps performs two valuable functions. First, it physically attaches the magnetically sensitive component to surface 41 of plate 40. Secondly, it provides electrical communication between the preselected locations on the first surface of the magnetically sensitive component 21 and the conductive circuit points 44 on surface 41. This, in turn, allows the conductive runs 46 to perform the valuable function of interconnecting preselected circuit points of the magnetically sensitive component and also connecting the magnetically sensitive component to an external device to provide signals from the magnetically sensitive component to external equipment.

Arrow 50 represents the laser beam that could be used to calibrate the magnetic sensor after the attachment of plate 40 to magnetically sensitive component 21 and after the attachment of the magnetically sensitive component 21 to the pole piece 12. The attachment of the second surfaces of the individual elements, 20, 22 and 24, of the magnetically sensitive component 21 to the pole piece 12 can be achieved through the use of epoxy. After the assembled elements in FIG. 6 are rigidly attached to each other, as shown, the laser can be used to trim the resistors on the integrated circuit chip 20 and calibrate the device. The value of calibrating the device after the assembly of the components in FIG. 6 is complete is that all or most of the induced stresses caused by the manufacturing processes are already in existence when the magnetic sensor is in the stage represented in FIG. 6 and can therefore be compensated by the resistor trim operation represented by arrow 50. The laser beam can pass through the transparent plate 40 and trim the resistors on the first surface of the integrated circuit chip 20. In most applications of the present invention, very little further assembly is required that would be expected to induce further stresses in the device. For example, it can be expected that an enclosure 60 will be disposed over the device shown in FIG. 6 in order to provide environmental protection for the device. The enclosure 60, illustrated in FIG. 6, would resemble a thin walled metallic can placed over the structure with the bottom surface of the can disposed in close proximity with the upper surface of plate 40 and the entire device shown in FIG. 6 disposed within the space inside the metallic can.

Figure 7:
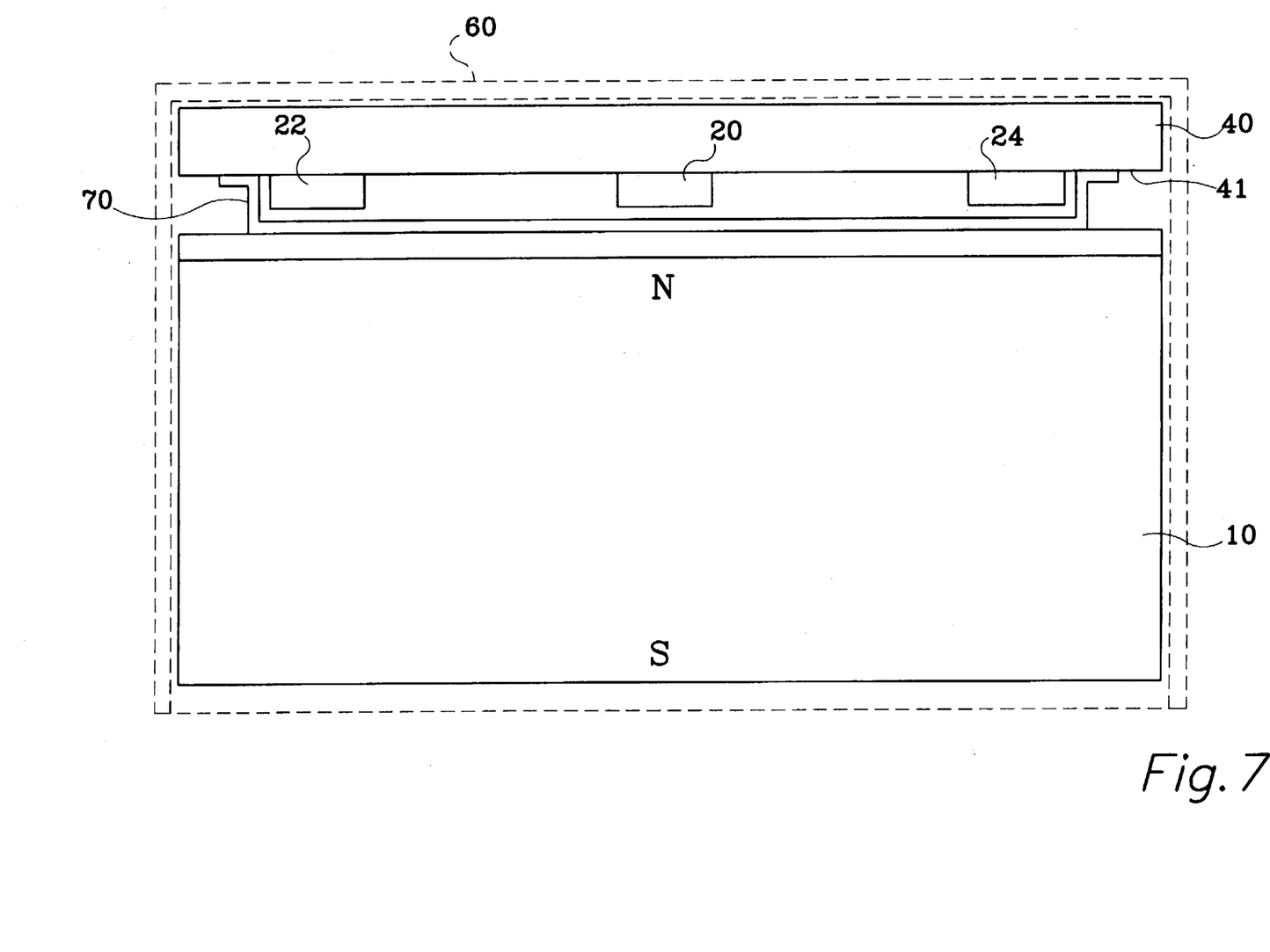
FIG. 7 is a side view of another embodiment of the present invention.

FIG. 7 shows a slightly modified alternative embodiment of the present invention. The plate 40 and the magnetically sensitive component 21, which comprises elements 20, 22 and 24, are manufactured in the same way as described above. In other words, the first surfaces of the individual elements of the magnetically sensitive component are provided with solder bumps which attach the elements to the circuit points 44 described above in conjunction with FIG. 4. However, rather than attaching the second surfaces of the magnetically sensitive component 21 directly to the upper surface of the magnetic structure, a cover 70 is attached to the plate 40, by epoxy or some other suitable material, and the cover 70 is then attached to the permanent magnet 10. In the embodiment represented in FIG. 7, the cover 70 is made of a ferromagnetic material and can serve as a pole piece. Alternatively, the cover 70 can be made from a nonferromagnetic material and an additional pole piece, such as that identified by reference numeral 12 in the discussion above, can be provided on the upper surface of permanent magnet 10. As in the preferred embodiment of the present invention, the magnetically sensitive component in FIG. 7 can be calibrated by a laser beam passing through the transparent plate 40.

Regardless of the specific structure or embodiment of the present invention, two primary advantageous characteristics are provided. First, the distance between the permanent magnet 10 and the ferromagnetic target is reduced relative to known magnetic sensors. Although the ferromagnetic target is not illustrated in FIGS. 6 or 7, it should be understood that the target would pass through the detection zone immediately above the upper surface of plate 40. As described above, a typical application of the present invention would generally provide some form of protective device, such as a metallic can 60, that would be disposed over the elements shown in FIGS. 6 or 7. The can 60, which is typically thin walled, would require a slight additional space above the upper surface of the plate 40, but this would typically be very minimal. The second advantage of the present invention is that it allows the magnetic sensor to be calibrated by a laser beam after the sensor is assembled to the state shown in either FIG. 6 or FIG. 7. This provides a significant advantage because it allows the sensor to be trimmed by the laser beam to perform a compensation of all stresses induced by the manufacturing procedures up to that point.

Although the present invention has been described in significant detail and illustrated to demonstrate two preferred embodiments, other embodiments are within its scope.

The embodiments of the invention in which an exclusive property or right is claimed are defined as follows:

1. A magnetic sensor, comprising:
   a permanent magnet structure;
   a magnetically sensitive component having a first surface and a second surface;
   a plate which is transparent to a preselected type of radiation, said first surface of said magnetically sensitive component being attached to said plate, said magnetically sensitive component being disposed between said permanent magnet structure and said plate; and
   a plurality of conductive elements disposed on a surface of said plate, said plurality of conductive elements being connected in electrical communication between preselected portions of said first surface of said magnetically sensitive component.

2. The sensor of claim 1, wherein:
   said permanent magnet structure comprises a permanent magnet and a pole piece disposed on a pole face of said permanent magnet.

3. The sensor of claim 1, wherein:
   said magnetically sensitive component comprises a plurality of individual chips, each of said plurality of chips being attached to said plate.

4. The sensor of claim 3, wherein:
   said magnetically sensitive component is attached to said plate by solder.

5. The sensor of claim 1, further comprising:
   a cover attached to said plate, said cover being shaped to encapsulate said magnetically sensitive component within a cavity formed between said cover and said plate.

6. The sensor of claim 5, wherein:
   said cover is attached to said plate with epoxy.

7. The sensor of claim 6, wherein:
   said cover is made of a ferromagnetic material.

8. The sensor of claim 1, wherein:
   said magnetically sensitive component comprises a Hall effect element.

9. The sensor of claim 1, wherein:
   said magnetically sensitive component comprises an indium antimonide element.

10. The sensor of claim 1, wherein:

said magnetically sensitive component comprises a magnetoresistive element.

11. The sensor of claim 1, wherein:

said magnetically sensitive component comprises an integrated circuit chip and at least one sensor chip.

12. The sensor of claim 1, wherein:

said magnetically sensitive component comprises a trimmable resistor element which is trimmed by a laser beam through said plate.

13. A magnetic sensor, comprising:

a permanent magnet structure;

a magnetically sensitive component having a first surface and a second surface;

a plate which is transparent to a preselected type of radiation, said first surface of said magnetically sensitive component being attached to said plate, said magnetically sensitive component being disposed between said permanent magnet structure and said plate; and a plurality of conductive elements disposed on a surface of said plate, said plurality of conductive elements being connected in electrical communication between preselected portions of said first surface of said magnetically sensitive component, said magnetically sensitive component being attached to said plate by solder.

14. The sensor of claim 13, wherein:

said permanent magnet structure comprises a permanent magnet and a pole piece disposed on a pole face of said permanent magnet.

15. The sensor of claim 13, wherein:

said magnetically sensitive component comprises a plurality of individual chips, each of said plurality of chips being attached to said plate.

16. The sensor of claim 13, further comprising:

a cover attached to said plate, said cover being shaped to encapsulate said magnetically sensitive component within a cavity formed between said cover and said plate.

17. The sensor of claim 16, wherein:

said cover is made of a ferromagnetic material and attached to said plate with epoxy.

18. The sensor of claim 13, wherein:

said magnetically sensitive component comprises a trimmable resistor element which is trimmed by a laser beam through said plate.

19. A magnetic sensor, comprising:

a permanent magnet structure, said permanent magnet structure comprising a permanent magnet and a pole piece disposed on a pole face of said permanent magnet;

a magnetically sensitive component having a first surface and a second surface;

a plate which is transparent to a preselected type of radiation, said first surface of said magnetically sensitive component being attached to said plate, said magnetically sensitive component being disposed between said permanent magnet structure and said plate; and a plurality of conductive elements disposed on a surface of said plate, said plurality of conductive elements being connected in electrical communication between preselected portions of said first surface of said magnetically sensitive component, said magnetically sensitive component being attached to said plate by solder, said magnetically sensitive component comprising a plurality of individual chips, each of said plurality of chips being attached to said plate.

20. The sensor of claim 19, wherein:

said magnetically sensitive component comprises a trimmable resistor element which is trimmed by a laser beam through said plate.

* * * * *